United States Patent [19]
Herring et al.

[11] 3,968,487
[45] July 6, 1976

[54] MULTIPLEXER-ANALOG/DIGITAL CONVERSION SYSTEM

[75] Inventors: William M. Herring, Elburn; Dennis B. Walling, Darien, both of Ill.

[73] Assignee: Standard Oil Company, Chicago, Ill.

[22] Filed: Oct. 15, 1974

[21] Appl. No.: 514,495

[52] U.S. Cl. ............. 340/347 AD; 340/172.5; 235/154
[51] Int. Cl.² ........................................ G06F 3/00
[58] Field of Search ........... 340/347 AD, 172.5; 235/154; 239/92 EA; 179/15 A

[56] References Cited
UNITED STATES PATENTS

| | | | |
|---|---|---|---|
| 3,418,652 | 12/1968 | Brooks | 235/92 EA |
| 3,665,417 | 5/1972 | Low | 340/172.5 |
| 3,702,989 | 11/1972 | Provenzano | 340/172.5 |
| 3,760,374 | 9/1973 | Nabi | 340/172.5 |
| 3,761,889 | 9/1973 | Hallee | 340/172.5 |
| 3,813,647 | 5/1974 | Loo | 340/172.5 |
| R28,221 | 11/1974 | Benghiat | 340/172.5 |

*Primary Examiner*—Charles D. Miller
*Attorney, Agent, or Firm*—Claron N. White; Arthur G. Gilkes; William T. McClain

[57] ABSTRACT

The system includes: a number of subassemblies, each containing a set of switches connectable at their pair of inputs to different sources of analog signals and containing a multiplexer/decoder having outputs connected to different switches for their selective actuation; a differential amplifier having a pair of inputs connected to the pair of outputs of all of the switches; analog/digital converter means having its input connected to the output of the amplifier and having outputs providing multi-bit digital information; and control means that provides various functions.

17 Claims, 3 Drawing Figures

MULTIPLEXER-ANALOG/DIGITAL CONVERSION SYSTEM

BACKGROUND OF THE INVENTION

1. Field of the Invention

The system of the invention is in the field of devices capable of providing a readout of analog signals obtained at various locations in apparatus in which a process or processes are performed. In this field the readout includes a conversion of each selected analog signal to binary information for local display or for storage or processing in an on-line computer.

2. Description of the Prior Art

A conventional system for transmitting analog information to a computer includes an analog front end of the computer that is usually located at or relatively close to the computer main frame. In this system of the prior art it is necessary to extend analog signal lines from the source of these signals, i.e., from process apparatus, for relatively long distances to the location of the computer. This use of analog signal lines for long distances is undesirable because of the effect of signal noise and distortion on the quality of the analog signal information received by the analog front end of the computer. This long distance transmission is not desirable for low-level analog signals, such as analog signals from thermocouples.

SUMMARY OF THE INVENTION

This invention relates to a multiplexer-analog/digital conversion system that is useful at a local area, i.e., the area of a number of analog signals such as are obtained in the monitoring of some conditions, such as temperature, within various zones of apparatus in which a process or processes are being performed. The system in each cycle of operation selectively converts one of these analog signals to binary information corresponding to the analog signal.

The binary information is locally displayed if the system is constructed to provide a local manual selection of the individual analog signals to be converted to digital information.

The system is preferably constructed to provide a scanning of a number of or all of the analog signals in a computerprogrammed sequence with the system for each individual readout and conversion controlled by signals from the computer and with the system providing binary information to the computer for storage and processing such as a printout of the information. In that construction of the system a communications bus from the computer to the general area of the analog signals has its binary information output channel providing binary information to the system for each cycle operation of the system to select an individual analog signal to be converted to binary information. The bus has its binary information input channel connected to the system to receive the binary information obtained by this analog/digital conversion by the system.

When the system is constructed for the computer selection and readout of the analog signals in binary form and also for local manual selection and local display of the binary information obtained by the conversion due to local selection, the system is constructed to provide a lockout of the local manual selection for local readout. The output channel of the bus has a line, provided with a signal by the computer, connected to the system to enable it and has another line to provide a pulse to the system to initiate, at the end of the pulse, the start of the operation of timer control means in the system. The enabling signal is used to lockout the operation of that part of the construction that provides a local manual selection of the analog signal to be converted and displayed locally. When the system is constructed for local manual selection and readout and for computer readout or scan, the local display is usually constructed in the system in the simplest manner whereby there is the local display during each operation of the system by command of the computer for the individual conversion of analog signals to binary information and the parallel transmission of the multi-bit signal of the latter by lines of the input channel of the bus to the computer.

The system of the present invention includes a number of subassemblies that are preferably printed circuit cards hereinafter referred to as "multiplexer cards." Each of these cards contains a number of switch means and a decoder/demultiplexer. Each switch means has a pair of inputs that are connectable to a different pair of wires providing a differential analog signal. In view of the number of multiplexer cards in the system and the number of switch means on each card, the system can be connected to a large number of differential analog signal sources provided at the general area of use. Preferably each of the switch means is connected to the wires providing the differential analog signals through a filter, such as a capacitor. These capacitors are also mounted on the multiplexer cards. Each of the decoder/demultiplexers has inputs to receive in parallel binary information and has outputs connected to different switch means on the same card so that one of the switch means is actuated in accordance with the multi-bit binary information provided to the inputs of the decoder/demultiplexer.

The system further includes control means, a differential amplifier and an analog/digital converter. The amplifier has a pair of inputs that are connected to the pair of outputs of all of the switch means on all of the cards and has an output connected to an input of the converter.

The control means has an input to receive a pulse that starts a timer system that is a part of the control means. The control means has a number of other inputs to receive signals as parallel multi-bit binary information. Some of the bits of information are used in the system to select the card to be interrogated and the balance of the bits are used to select the specific switch means of any of the cards to be actuated so that the combination of all of these bits of the binary information provides a selection of a specific switch means on a specific card for a specific cycle of operation of the system. The control means is constructed to provide an output signal to enable a specific decoder/demultiplexer. Because each of the decoder/demultiplexers on the cards has its inputs connected to outputs of the control means, the enabled decoder/demultiplexer receives from the control means the multi-bit binary information provided to it as information corresponding to the specific switch means of that card to be actuated by the operation of the decoder/demultiplexer on the basis of the bits at its input. The control means also has an output connected to an input of the analog/digital converter and this output is provided a pulse by the timer system after a delay following the start of the operation of the control means. During the brief time of this pulse the converter converts the analog signal, received at its input from the output of the amplifier, to multi-bit binary information. The timer system of the control means at the completion of this pulse provides a system feedback signal that continues for the balance of the cycle of operation of the control means and thus of the system. This feedback signal permits the computer to recognize that the system is active and is furnishing valid converted information.

In one aspect of the system of the invention in which there is a manual selection of an analog signal and its conversion along with a display of the binary information corresponding to the differential analog signal of any one of the analog signals, the system further includes manual selector means and display means. The manual selector means is constructed to provide at its outputs multi-bit binary information, part of which is used to select the multiplexer card to be interrogated and part of which is used to select the switch means of that card to be actuated. These outputs of the manual selector means are connected to the number of inputs of the control means that receives such binary information. The manual selector means is constructed to provide by manual operation a pulse at another output of the selector means and that output is connected to the input of the control means, that receives a pulse to initiate the timer means. The display means includes a set of optical display devices corresponding in number to the number of outputs of the analog/digital converter to which inputs of these display devices are connected so that the "on" or "off" condition of the optical devices indicates the binary information that is the output of the converter. The display means also includes preferably a number of additional optical devices that by their condition display the multi-bit binary information provided by the manual selector means to indicate the selection of switch means and the card on which it is mounted.

In a second aspect of the system of the invention in which there is a computer selection, sequentially or in a random manner, of each of a number of analog signals and its conversion, by the system for transfer to the computer, to multi-bit binary information corresponding to the differential analog signal of the selected analog signal. The system in this aspect also includes gate means having inputs connected to the outputs of the analog/digital converter. The gate means has outputs connected in this use of the system to the binary information input channel of a communications bus connected to the computer. These gate means are opened to the input channel of the communications bus by the control means upon receipt of the device select signal from the computer, which enables this specific system as distinguished from other computer interface systems. This signal is maintained until the completion of the cycle of the operation of the system that selects the analog signal, converts it to multi-bit binary information and then presents it to the input channel of the communications bus for a sufficient period of time. In this aspect of the system the control means has its number of inputs that are to receive binary information connected in this use to the binary information output channel of the communications bus.

In this second aspect of the system of the present invention, the control means has another input connected to another line of the binary information output channel of the bus to receive a pulse to initiate the operation of the timer system of the control means. The timer system upon receipt of that pulse provides a signal to permit amplifier settling and to enable operation of the analog/digital converter. The control means further includes an output in its timer system that provides a signal to the binary information input channel of the bus at the completion of the operation of the analog/digital converter. This signal, when recognized by the computer, advises the computer that the input channel has from the converter multi-bit binary information that is ready to be read and stored with or without subsequent processing by the computer. Then before the completion of operation of the system the computer reads this information.

In the second aspect, the system connects outputs of the gate means to the digital information input channel of the bus through the use of optical coupling provided by optically-coupled isolators connected to the gate means outputs and to lines of the input channel. The output channel is also connected to the inputs of the control means through optically-coupled isolators. Similarly, there is optical coupling of the input channel to the output of the control means that provides the signal informing the computer that the analog/digital conversion has been completed. The use of the optical coupling of the system to the output and input channels of the communications bus eliminates interference between the computer and the system and between the system and any other interface device connected to that communications bus. The additional interface device or devices may be additional systems of the invention located at other general areas but connected by the same bus to the relatively remote computer. The additional interface devices may be at the same general area. One of such interface devices is the system disclosed and claimed in our copending patent application, Ser. No. 500,321, entitled "Multi-Counter Register," filed Aug. 26, 1974. The disclosure of that copending patent application is hereby incorporated by reference. As described later, one or more of the systems of that invention or additional systems of the present invention and even other interface devices can be present at the same general area or a number of general areas at a location or locations that are relatively remote from the computer. Because of the construction of the present system, it can use the lines of the input and output channels of one communications bus used for other interface devices rather than installing lines for transfer of voltage signals to a relatively remote area for analog to digital conversion.

The second aspect of the system of the invention preferably has a construction that includes the manual selector means and the display means. In this preferred construction of the second aspect of the invention, the control means is constructed to provide a lockout of the binary information provided to the control means by the manual selector means, for selection of card and switch means, during the time that the control means receives from the output channel of the bus a signal that operates the control means for interrogation of the system by the computer.

In the especially preferred construction of this aspect of the system, the display means is not locked out but rather the control means provides the display, by some of the optical devices, of the multi-bit binary information that is the output of the converter. The specific construction also is such that the other of the optical devices provide, during the computer interrogation and analog conversion, a visual display of the multi-bit binary information, indicating the card and the switch means, in the output channel of the bus during this computer operation of the system of the invention.

Another part of the especially preferred construction of the second aspect of the system of the present invention includes a thermally insulated box located in the general area of the assembly of the other components described above. Within this box is a relatively thick plate of a metal, such as aluminum, that is a good thermal conductor. A number of terminal strips are mounted on the plate. Each of the strips has a number of double pairs of connectors. The strips essentially insulate the connectors electrically from the plate but not thermally to an undesirable extent. The two connectors of each pair for each double pair of connectors are electrically connected to the other pair. One of the pair is connected to wires providing the differential analog signal and the other pair of each of the two pairs is connected to a different one of the filters connected to the switch means for each of the multiplexer cards.

Three of the double pairs of connectors are not thus connected to the sources of process analog signals to be interrogated but are connected to three special signal sources. One of these is a Wheatstone bridge, hereinafter referred to as a "RTD bridge," that has its other two junctions connected to the two free ends of a surface platinum resistance temperature detector that has its joined ends of the wires mounted on the center portion of the metal plate in the insulated box. The RTD bridge is located outside of but adjacent the box as are the cards and other components described earlier. Another of the special signal sources is connected by wires to a span reference voltage source provided by a circuit also adjacent the box. The third special signal source provides a zero reference voltage by shorting a pair of connectors.

In view of the construction of the combination of components, described above as present in the insulated box, the ends of the pairs of wires of the analog sources are at the same temperature, insured by the heat sink effect of the metal plate. This temperature, as the analog signal of the platinum resistance temperature detector, is converted using the system and sent to the computer as multi-bit binary information. Similarly, the span reference analog signal and the zero reference analog signal are amplified and converted by the analog/digital converter to multi-bit binary information that is sent to the computer. From these three sets of binary information the computer can determine the correction factors required for any deviation, e.g., that caused by thermal offset or other changes that occur in the operation of the amplifier and for cold-junction correction computations by the computer. To provide these three sets of information for correction of the binary information obtained by the system for the different analog signals from the adjacent apparatus being monitored, the computer, for three cycles of operation of the system, provides signals in those lines of the binary information output channel of the communications bus that select a card and select the switch means, as in other cycles select differential (or single-ended) analog voltages from the process apparatus by actuating the corresponding switch means on the cards. The computer makes changes in the other sets of multi-bit binary information received by these other cycles of operation of the system using this correction factor. The scanning can be random or sequential. Of course, the filters and switch means to transfer these three analog signals used for the correction factor determination can be on any card or different cards and on any position on any card.

DETAILED DESCRIPTION

Figure 1:
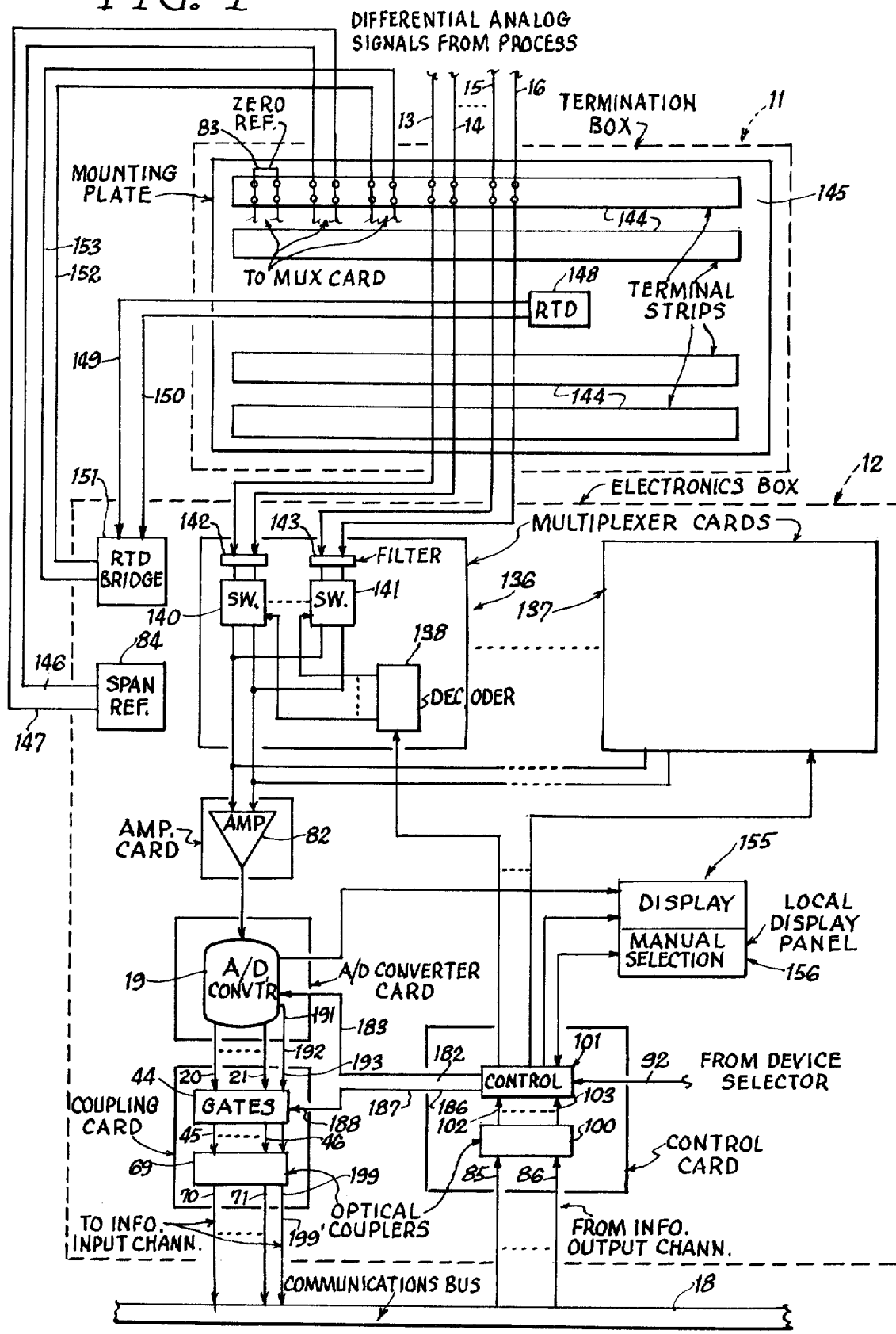
FIG. 1 is a block diagram of the preferred embodiment of the system of the invention.

As seen in FIG. 1, the preferred embodiment of the system includes an insulated termination box generally indicated at 11 and an electronics box generally indicated at 12 that is located adjacent box 11. The boxes 11 and 12 are located for used in the general area of sources of differential analog signals provided by sensors on an apparatus as a pair of wires 13 and 14, a pair of wires 15 and 16, and other pairs of wires indicated schematically by a dotted line between wires 14 and 15. The system is connected to a computer (not shown), such as Modcomp II minicomputer, that is located hundreds of feet away from the system, by a communications bus 18 that extends from the computer to a position adjacent electronic box 12 and that may extend to other areas at which are located additional systems of the invention or other interface devices for their connection to the computer.

The communications bus 18 has two channels that relate to information transfer function. One channel is a digital information output channel to transfer information from the computer to the system of the invention. The other channel is a digital information input channel to transfer information from the system to the computer. Each channel comprises a number of twisted pairs of wires. One wire of each pair carries the information and the second wire of each pair is tied to the second wire of all other pairs in the channel and grounded to prevent crosstalk between information wires. The bus 18 also contains a +5 v logic level power supply line and a computer common line at ground potential. The grounded second wires of the digital information input channel can serve as the computer common line. The wire of each pair that carries the information is referred to in the description that follows as a bit. Thus the two channels are mulit-bit channels.

The mulit-bit binary information transmitted from the system to the digital information input channel is mostly information from the outputs of an analog/digital converter 19 of the system. In this illustrative description of the system, converter 19 is a 12-bit analog/digital converter. The outputs of converter 19 are connected indirectly as described later, to 12 bits of the digital information input channel. Bits 0–11 carry the digital information from converter 19 in binary form. Another bit of digital information input channel of bus 18 carries to the computer a system feedback signal to inform the computer that the system has placed on this channel of bus 18 the information obtained by the system performing an analog/digital conversion of a differential analog signal that was selected by the computer at the initial period of a cycle of operation of the system. As described later, this feedback signal is provided by another component of the system when that component is furnished a pulse from the status output of converter 19 during its conversion operation.

Figure 3:
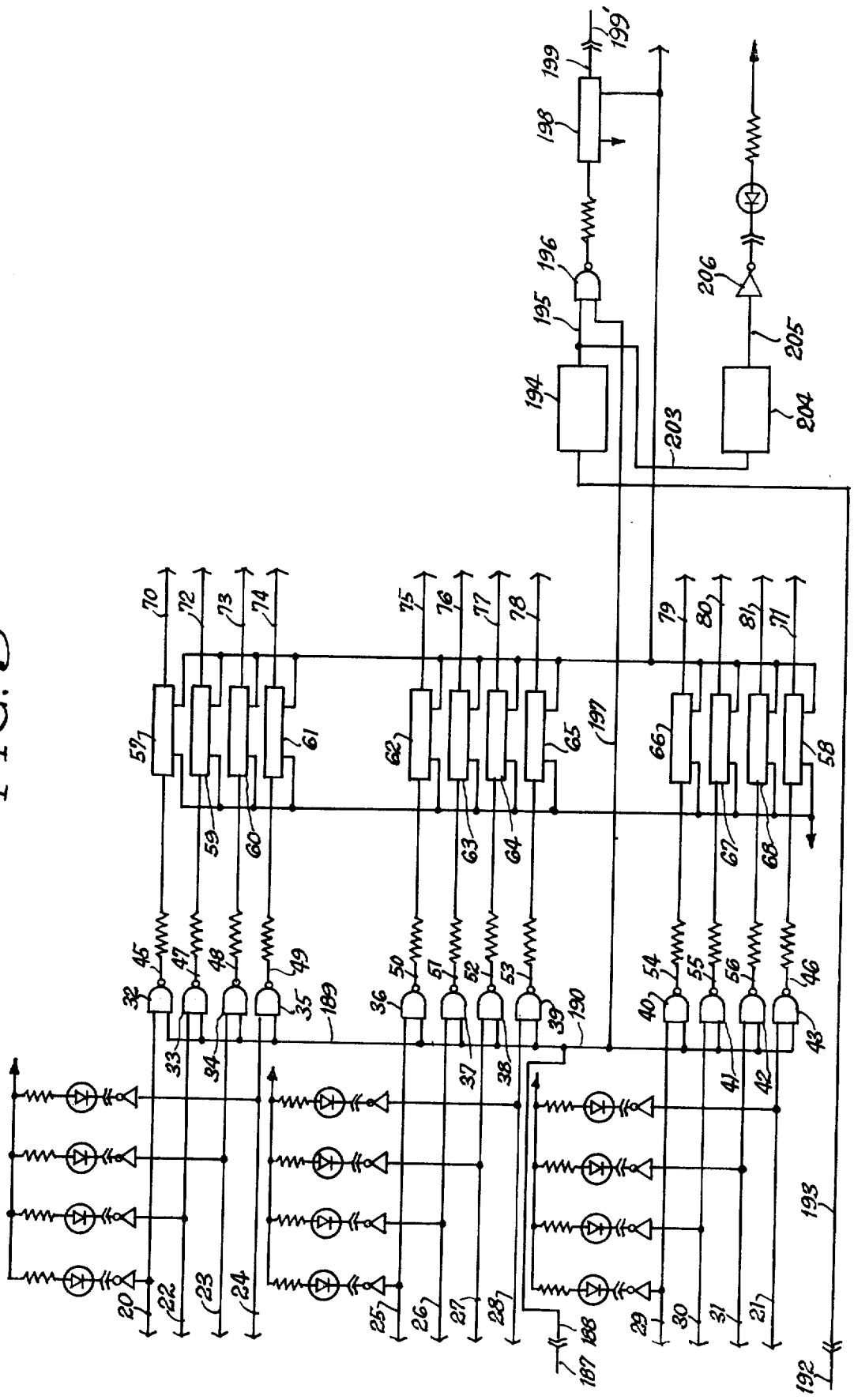
FIG. 3 is an electrical schematic drawing of another part of the circuitry of the system.

The operation of converter 19 provides at its outputs 12-bit binary information. These outputs are connected to lines 20 and 21 and other lines schematically indicated by a dotted line between lines 20 and 21 and shown as lines 22 through 31 (FIG. 3). The lines 20–31 are connected to one input of each of NAND gates 32–43 (FIG. 3), respectively, of gate means 44. The outputs of these NAND gates are connected to lines 45 and 46 and other lines schematically shown by a dotted line between lines 45 and 46 and shown as lines 47–56 (FIG. 3). The lines 45–56 are connected through resistors (not numbered) to optically coupled isolators 57–68 (FIG. 3), respectively, of optical coupler means 69. Each isolator has an output and the outputs are connected to lines 70 and 71 and other lines schematically shown by a dotted line betwen lines 70 and 71 and shown as lines 72–81 (FIG. 3). The lines 70–81 are conventionally connected to 0–11 bits of the binary information input channel.

For convenience of assembly of the various components in electronics box 12 most of them are mounted on printed circuit cards that provide modules for convenient assembly and to tailor the system for various numbers of signals to be interrogated etc. Many of the modules, as cards, provide a number of components on a card that are connected by printed conducting lines. Illustrative of this are gate means 22 and optical coupler means 25 that are mounted on the same card, identified as a coupling card having various conducting lines printed on it to connect the outputs of gate means 44 to the inputs of optical coupler means 69 as well as to provide various conducting lines that are connected to the NAND gates of gate means 44 and to some lines connected to outputs of converter 19 and to other lines connected to the second input of the NAND gates and to a common input for the purpose described later. In electronics box 12 there is a differential amplifier 82 that is illustratively a fixed span/gain amplifier with an input minimum of −5 mv and a maximum of +50 mv. A shorted multiplexer address provides a 0 mv reference 83 for amplifier 82; a precision source of known millivoltage (illustratively +48 mv) on a second address provides a span reference 84.

Figure 2:
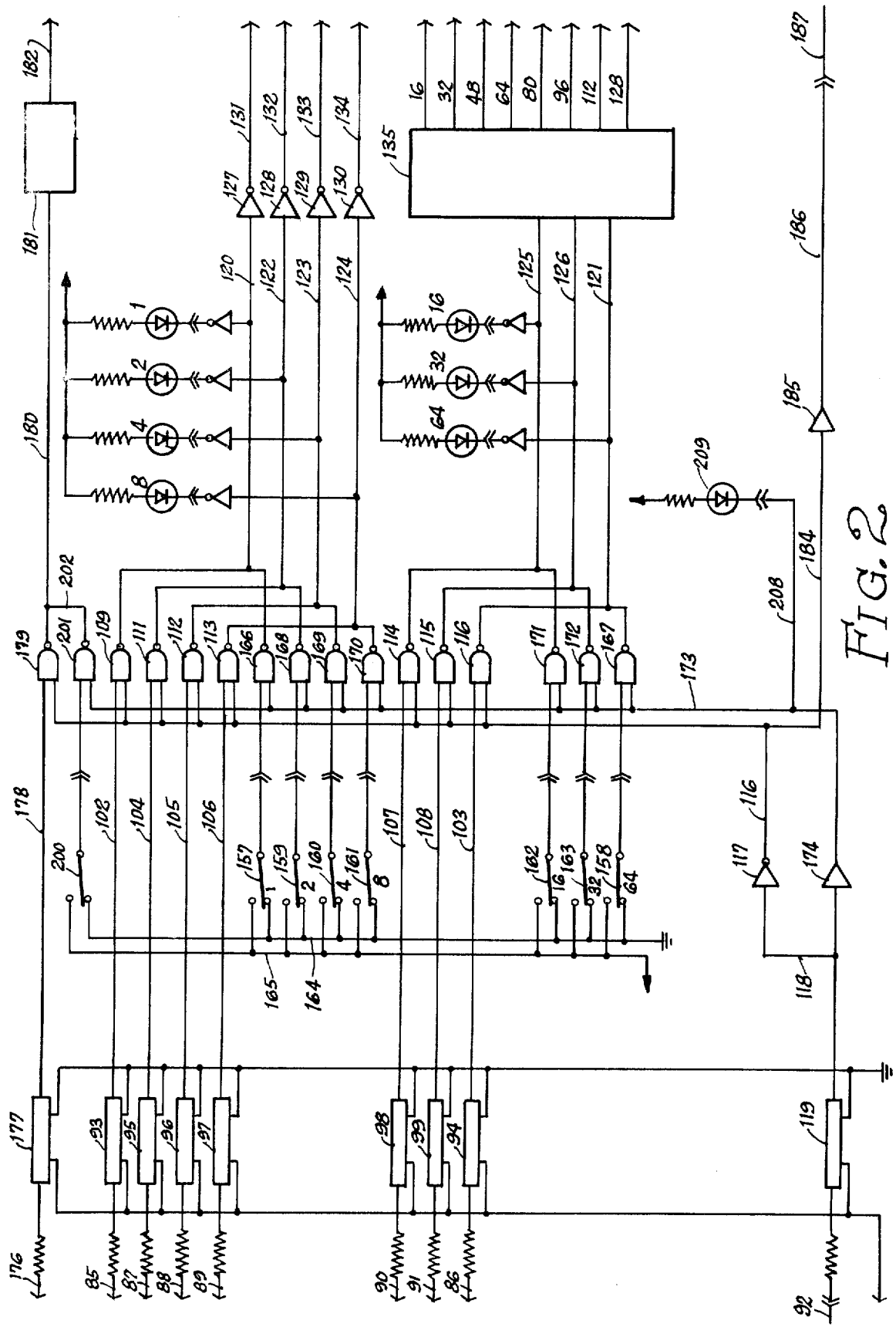
FIG. 2 is an electrical schematic drawing of a part of the circuitry of the control means and of the manual selector means of the system of FIG. 1.

A number of bits of the digital information output channel of bus 18 is connected to lines 85 and 86 and additional lines represented by a dotted line between lines 85 and 86 and shown as lines 87–91 (FIG. 2). The digital information output channel that is used has 21 bits but only some of these are used with the system of the present invention described in the specific illustration of the preferred embodiment. These bits are used also with other interface devices at the same general area and other general areas also remote from the computer. Bits 4 through 8 are used to provide, from the computer, signals to an interface device selector (not shown). This device selector has a decoder/demultiplexer that decodes input signals from these bits into one of a number of mutually exclusive outputs for selection of the interface device to be interrogated by the computer. One output of this device selector is connected to a line 92 that provides an enable signal to the system being described when the computer selects this specific system of the invention. Of course, to select another one of the systems, an enable signal would be provided by a different output of the device selector and that output would be connected to the other system of the invention.

The lines 85–91 are connected through resistors (not numbered) to an input each of different optically-coupled isolators 93–99 (FIG. 2), of optical coupler means 100 mounted on a control card with a control means generally indicated at 101. The lines 85–91 are connected, illustratively, to bits 9 through 15 of that channel. The outputs of isolators 93–99 are connected to inputs of control means 101 by lines 102 and 103 and other lines indicated in FIG. 1 by a dotted line between lines 102 and 103 and shown in FIG. 2 as lines 104–108.

The lines 102–108 are connected to one input each of NAND gates 109–115 (FIG. 2), respectively, of control means 101. The other input of each of NAND gates 109–115 is connected, as shown in FIG. 2, by branch lines (not numbered) to a line 116 that is connected to an output of an inverter 117. The input of inverter 117 is connected by a line 118 to an output of an optically-coupled isolator 119 that has an input connected by a line (not numbered) that is connected through a resistor (not numbered) that is connected to line 92. The lines 116 and 118, inverter 117, isolator 119 and the resistor are a part of control means 101 and thus are mounted on the control card with isolators 93–99 and NAND gates 109–115.

The outputs of NAND gates 109–115 are connected to lines 120–126, respectively, that are connected to the inputs of inverters 127–130, respectively. The outputs of inverters 127–130 are connected to lines 131–134, respectively. Each of lines 121, 125 and 126 is connected to a different input of a 4-line-to-16-line decoder/demultiplexer 135, illustratively the ABC inputs of decoder/demultiplexer SN74154 made by Texas Instruments Inc. The lines 125, 126 and 121 are connected to the A, B and C inputs, respectively.

In the illustrative construction of the preferred embodiment, being described, there are eight multiplexer cards (MUX), each generally indicated by cards 136 and 137 in box 12 (FIG. 1). The other multiplexer cards are indicated as present by a dotted line between cards 136 and 137. Each of these eight cards is a printed circuit card on which is mounted a number of components described later.

Eight outputs of decoder/demultiplexer 135 are connected to lines (not numbered) that are a part of the printed circuitry of the control card. Of course, decoder/demultiplexer 135 is a part of control means 101 and thus it is mounted on the control card.

Each of the eight unnumbered lines, that is connected to the outputs of decoder/demultiplexer 135 is connected, by a line to a different multiplexer card. Each of these lines to a card is connected to an enable input of a decoder/demultiplexer. The eight decoders/demultiplexers are mounted on the eight multiplexer cards. The one on card 136 is decoder/demultiplexer 138 (FIG. 1).

The lines 131–134 are connected by four lines to the four inputs of decoder/demultiplexer 138 that is, as is the case also for the decoders/demultiplexers on the other seven multiplexer cards, a 4-line-to-16-line decoder/demultiplexer SN74154. These four lines connecting lines 131–134 to each decoder/demultiplexer on the eight cards and the lines connecting each of the eight outputs of decoder/demultiplexer 135 to the decoders/demultiplexers on the multiplexer cards are, of course, sets of five lines to each multiplexer card from control means 101 on the control card. These sets of lines are shown by two lines (unnumbered), one each to a multiplexer card with the other sets of five lines indicated by a dotted line between those unnumbered lines.

The construction of multiplexer card 136 is described below and it is representative of the construction of the other seven multiplexer cards. In the illustration, card 136 is a printed card on which is mounted, in addition to decoder/demultiplexer 138, switch means comprising 16 switches mounted on card 136. The switches include switch 140 and switch 141 that are shown. The other 14 switches are indicated by a dotted line between switches 140 and 141. The switches are DPST reed relays or solid state switches for high-speed switching. The two inputs of each of these switches are electrically connected to filters, such as filters 142 and 143 that are also mounted on card 136.

Each of the filters has its two inputs connected by lines (not numbered) to a different pair of connectors of a double pair of connectors mounted on terminal strips 144 that are mounted on a ¼-inch aluminum plate 145 in box 11. These pairs of connectors on strips 144 are connected electrically to other pairs of connectors on strips 144 to which are connected different pairs of wires providing differential analog signals. All but three of these signals are from various parts of a process apparatus or of process apparatus to be interrogated.

One of the double pairs of connectors has one pair connected to zero reference analog signal 83 while the other pair is connected to one of the filters of one of the multiplexer cards. Another pair of double pair of connectors is connected by lines 146 and 147 to span reference signal source 84 while its other pair is connected to another filter on one of the multiplexer cards. A surface platinum resistance temperature detector 148 is mounted on plate 145 and is connected by its lines 149 and 150 to two junctions of a Wheatstone bridge 151 mounted in box 12. The other junctions of bridge 151 are connected by lines 152 and 153 to two of another double pair of connectors to connect the analog signal by the other two of that double pair of connectors to another filter on one of the multiplexer cards. Preferably these three analog signals are provided to the first three switches on the first multiplexer card to be interrogated by the computer so that they are the first analog signals that are interrogated by three cycles of operation of the system by a computer scan. For simplicity in FIG. 1 lines providing a differential analog signal from the process apparatus are connected to switch 140 but, assuming car 136 is the first card, switch 140 and the next two switches would be connected preferably to these three reference differential analog signals.

The terminal strips 140 provide sufficient electrical insulation of the connectors from plate 145 but do not thermally preclude the use of plate 145 as a heat sink for the ends of the pairs of wires, i.e., lines, from the various sources of differential analog signals.

Each of the switches, such as switches 140 and 141, on all eight multiplexer cards has two outputs that are connected to two inputs of amplifier 82 by a pair of lines as indicated in FIG. 1. As seen in that drawing the printed circuitry of each card provides lines connecting these output lines from the switches so that from each card only two output connections are required to make the connection by a pair of lines from each card to the printed card on which amplifier 82 is mounted. Those pairs of lines are connected to printed circuitry on the amplifier card for a common connection to the pair of inputs of amplifier 82.

As seen in FIG. 1, the electronics box 12 has mounted on it a display means generally indicated at 155 and a manual selector means generally indicated at 156, that are mounted on a local display panel.

The display means 155 is connected to converter 19 by a schematic line (not numbered) that represents 12 lines connected to the 12 outputs of converter 19. These outputs are those connected to lines 20–31 described above. The display means 155 is also connected to control means 101 as shown by a schematic line (not numbered) that represents seven lines connected to lines 120–126. As seen in FIGS. 2 and 3, the display means 155 has 19 unnumbered light-emitting didoes (LED) that are connected by 19 lines (not numbered) to 7 pin connectors on the control card and to 12 pin connectors on the converter printed circuit card on which converter 19 is mounted. These connections of the lines are by pins and sockets as shown in FIGS. 2 and 3. The pins are connected to lines of the printed circuitry of both cards that are connected to outputs of inverters (not numbered) that have their inputs connected to lines 20–31 and to lines 120–126.

In view of the foregoing construction of display means 155 and its connections to converter 19 and to control means 101 the LEDs provide at the general area of the system as optical display, in binary form, the identifying code of the multiplexer card and the switch of that card selected for the cycle of operation of the system that is being performed and the binary value corresponding to the differential analog signal being interrogated.

The manual selector means 156 includes manually-operated latching switches 157–163 (FIG. 2) that, when unlatched are connected to a common line 164 that is connected to ground potential, and when switched to latched position are connected to a line 165 that provides through the latched switch or switches a +5 v signal to their output lines. The output lines of switches 157–163 are connected to lines on the control card, by pins and sockets. Each of these lines of the printed circuitry on the control card is connected to one input of NAND gates 166–172 mounted on the control card and constituting another part of control means 101. The other input of each of these NAND gates is connected to a line 173 of the printed circuitry of the control card. The line 173 is connected by a driver 174 to line 118 for connection to isolator 119. The signal in line 92, that selects the system for computer interrogation and readout, only provides a signal to line 116, through inverter 117, for NAND gates 109–115 but also provides the signal by line 73 to NAND gates 166–172 to lockout the signal provided by one or more of switches 157–163 if latched closed by a manual selection. The lockout prevents an output signal from any of NAND gates 166–172 that are connected to lines 120–126, respectively. Of course, when there is no signal in line 92, as is the case when the computer is not operating the system, lines 120–126 have signals corresponding to the condition, latched or unlatched, of switches 157–163 to provide input signals, by line 120 and lines 122–124, as binary information to the decoders/demultiplexers on the multiplexer cards and to provide input signals, by lines 121, 125 and 126, as binary information to decoder/demultiplexer 135 of control means 101 that enables one of the decoders/demultiplexers of the eight multiplexer cards for an actuation of one of the 128 switches on the multiplexer cards as determined by the latching of switches 157–163 for a manual selection.

A line 176 (FIG. 2) is connected to the 0 bit of the digital information output channel of bus 18. The line 176 is also represented by the dotted line between lines 85 and 87 (FIG. 1) representing connecting lines from the output channel to gate means 100. This connection is also through a resistor (not numbered) and then by an isolator 177 (FIG. 27) on the control card. The output of isolator 177 is connected by a line 178 to one input of a NAND gate 179 mounted on that card. The other input of gate 179 is connected to line 116. The output of gate 179 is connected by a line 180 to an input of a monostable multivibrator 181 having an output connected to a line 182.

The isolator 177, NAND gate 179 and multivibrator 181 are all mounted on the control card and constitute another part of control means 101. Of course, lines 176, 178 and 180 are part of the printed circuitry on the control card. A line 183 (FIG. 1) is connected to line 192 and to an input of analog/digital converter 19 mounted on the converter card.

For the initiation by the computer of a cycle of operation of the system an execute pulse is provided by the computer to the 0 bit of the digital information output channel. This pulse is transmitted by line 176 to isolator 177 that transmits a pulse through line 178 to one input of NAND gate 179. At the time that the computer initiates the execute pulse to the 0 bit of the output chanel, the computer by the 4–8 bits of the digital information output channel provides a set of signals to the interface device selector means, namely, a decoder/demultiplexer that provides an output signal exclusively at the output connected to the line 92 for a selection of the system being described. This device select signal to isolator 119 results in a signal from it to inverter 177 and the signal from that inverter is provided to the other input of NAND gate 179. As a result of this signal and the execute pulse to the other input of NAND gate 179, the output of NAND gate 179 provides a pulse to multivibrator 181.

By choosing appropriate timing components the output pulse length of multivibrator 181 can be varied from nanoseconds to seconds, as is well known. In the illustrated operation of the system of the present invention the timing components are chosen so that the output pulse of multivibrator 181 continues until after about 3 milliseconds measured from the time of the trailing edge of the execute pulse. This length of the output pulse of mulitvibrator 181 provides a settling time for amplifier 82 before the analog/digital conversion described below.

At the time that the computer initiates the execute pulse in the 0 bit of the output channel of bus 18, the computer provides by the 9–15 bits of the output channel of bus 18 the digital information for control means 101 that results in a selection of one of the multiplexer cards and the actuation of one of the switches on the selected card to provide a differential analog signal to amplifier 82. This presentation of this differential analog signal to amplifier 82 continues to the end of the cycle of operation. Thus the analog signal is provided to the two inputs of amplifier 82 during the time that there is the output pulse of multivibrator 181, i.e., during the settling time of amplifier 82, and for the balance of the cycle of operation of the system.

During the cycle of operation the signal in line 92 from the interface device selector means provides an inverted signal in line 116 (FIG. 2). A line 184 is connected to line 116 and is connected through a driver 185 to a line 186, all on the control card. The line 186 is connected by a pin and socket to a line 187 (FIGS. 1, 2). By a pin and socket, line 187 is connected to a line 188 (FIG. 3) that is connected by lines 189 and 190 and branch lines (not numbered) from them to the other input of each of NAND gates 32–43 on the coupling card so that these gates are enabled for the cycle of operation.

The output of multivibrator 181 is connected by lines 182 and 183 (FIG. 1) to the trigger input of converter 19. An illustrative analog/digital converter is ADC-QM analog-to-digital converter sold by Analog Devices, Inc., Norwood, Mass. The leading edge of the output pulse of multivibrator 181 resets converter 19. After the delay for the settling of amplifier 82 this pulse from multivibrator 181 terminates and its trailing edge initiates the conversion operation of converter 19. During the conversion operation the status output of converter 19 is at the 1 level. At the completion of the conversion, that illustratively occurs in 25 microseconds, the status output reverts to the 0 level. The status output thus provides a pulse during the conversion to a line 191 connected to the status output. The line 191 is a part of the printed circuitry of the converter card. The line 191 is connected by a pin and socket to a line 192 that is connected by a pin and socket to a line 193 on the coupling card as a part of its printed circuitry. As seen in FIG. 3, the line 193 is connected to an input of a monostable multivibrator 194. Thus the status output of converter 19 provides during its conversion operation a pulse to multivibrator 194 that has timing components to provide an output signal, illustratively of about 3 milliseconds, to a line 195 connected at its other end to one input of a NAND gate 196 of gate means 44 mounted on the coupling card. The other input of NAND gate 196 is connected by a line 197 to line 190 that already has the signal from inverter 117 based on the input to that inverter of the device select signal from the start of the cycle of operation. Thus NAND gate 196, when it is signalled by multivibrator 194, provides an output feedback signal for the timing period of multivibrator 194. The output of gate 196 is connected by a resistor (not numbered) to an input of another isolator 198 of optical coupler means 69 on the coupling card. The output of isolator 198 is connected to a line 199 on that card. By a pin and socket, line 199 is connected to a line 199' that is connected to the 16 bit of the digital information input channel. By this construction the converter status output provides to the input channel a system feedback signal that continues for the balance of the cycle of operation. This signal, when recognized by the computer, advises the computer that the input channel has, from converter 19, multi-bit binary information that is ready to be read and stored with or without subsequent processing by the computer. Before the termination of the output signal, i.e., system feedback signal, from multivibrator 194 the computer reads this information.

When multivibrator 194 has timed out the cycle of operation is completed. In the event that the computer is programmed to interrogate another analog signal of the same system it provides an execute pulse to the 0 bit, maintains the set of digital information in the 4–8 bits to the interface device selector to continue the device select signal in line 92, and provides a new set of binary information to the 9–15 bits to actuate another switch etc. for another cycle of operation of the system. During this subsequent cycle and any other cycles of the operation of the system by the computer, whether random or sequential, the manual selection is locked out each time that the interface device selector provides a signal via line 92 and thus to line 173.

When the computer is not operating the system, the inputs of NAND gates 166–172 have the signal provided by line 173 at the other logical level such that the other inputs of these gates that are connected to latching switches 157–163 provide logic levels at the outputs of gates 166–172 that represent the position of switches 157–163. These outputs of gates 166–172 are connected to lines 120–126. As a result, the position of switches 157–163, i.e., connected to line 164 or line 165, determines the selection of the multiplexer card and actuation of the manually selected switch on that selected multiplexer card. The cycle of operation for the manual interrogation is initiated by a momentary connection of a nonlatching switch 200 to line 165. The switch 200 and switches 157–163 are mounted on the local display panel as a part of manual selector means 156. The switches 157–163 and 200 are spring biased for connection to line 164 but switches 157–163 have latch pins so that when one is depressed to connect it to line 165 it remains latched in its connection with line 165 until all latched switches are returned to connect with line 164 by depression of unlatching means to a new manual selection of an analog signal to be interrogated and converted to digital information in binary form by another cycle of operation of the system. The manual selector means 156 also has reset means (not shown) to provide this unlatching of any switches that have been latched to connect gates 166–172 to line 165.

The switches 157–163 and switch 200 are connected to gates 166–172 and a gate 201 of control 101 on the control card using lines (not numbered) connected by illustrated (FIG. 2) pin and socket connectors to lines (not numbered) connected to these one inputs of the gates. The other input of gate 201 is connected to line 173 so that the gate 201 cannot be enabled when the computer provides the device select signal on line 92 to the system and thus on line 173. When such device select signal is not provided, the momentary closing of nonlatching switch 200 results in a pulse from the output of gate 201 to line 180 that is connected to that output of gate 201 by a line 202. That pulse functions in the same way as the pulse provided by the output of gate 179 for the initiation of the operation of multivibrator 181 when the 0 bit of the output channel provides an execute pulse, from the computer, to gate 179 via line 176.

At the trailing edge of the output pulse of multivibrator 181, i.e., after the settling time of amplifier 82 connected to the selected switch of one of the multiplexer cards, the conversion operation of converter 19 is initiated. The 12-bit output of converter 19 is provided to lines 20–31 from which it is transferred in parallel to 12 inverters mounted on the coupling card. The outputs of these inverters are connected with lines and pins and sockets to 12 LEDs mounted on display means 155. These 12 lines connecting the 12 inverters to the twelve LEDs are shown for simplicity in FIG. 1 as a single line 202 extending to display means 155 from converter 19. Because there is no device select signal provided by line 92 the voltage level in line 188 and thus in lines 189 and 190 is such that gates 32–43 are not enabled, i.e., they are closed. Thus the signals in lines 20–31 are not transmitted to the 0–11 bits of the digital information input channel of bus 18. Instead, there is only the local optical display in binary form of the digital information obtained by the conversion of an analog signal selected manually by the latching of certain switches of switches 157–163 and the initiation of the cycle of operation by the momentary closing of switch 200.

Because of the voltage level in line 116 (FIG. 2) and thus in lines 184, 186–190 and 197, gate 196 (FIG. 3) is not enabled. Accordingly, there is no feedback signal to the 16 bit when converter 19 provides a status output pulse to multivibrator 194 during its conversion operation of the analog signal manually selected.

The line 195 (FIG. 3) is also connected to a line 203 that is also a part of printed circuitry of the coupling card. The other end of line 203 is connected to an input of a monostable multivibrator 204 that is set by timing components for an output signal illustratively for a duration of 50 milliseconds. This output of multivibrator 204 is connected by a line 205 to an input of an inverter 206 also mounted on the coupling card. The output of inverter 206 is connected by a line (not numbered) on the coupling card. That line by a pin and a socket is connected to a line (not numbered) extending to display means 155 for a connection to another LED (not numbered) that is lit when multivibrator 204 has an output signal. The time that the LED is thus lit is sufficient to visually note the fact that there is an output from multivibrator 194. That indicates the system is operating. The time of the output signal from multivibrator 194 is too short for a visual observation if the LED were connected directly to that output. The presence of multivibrator 204 provides a longer signal to the LED for this visual determination.

Referring to FIG. 2, it is noted that the numbers 1, 2, 4, 8, 16, 32 and 64 appear below switches 157, 159–163, and 158, respectively. These numbers appear on the latching switches at the display panel. Where an operator selects a specific multiplexer card to have one of its analog signals interrogated and converted, one or more of switches 157 and 159-161 will be latched to connect to line 165. For a manual operation this will result in signals in lines 120 and 122-124 to each of the multiplexer cards. This 4-bit information is displayed by "on" or "off" condition of four LEDs at display means 155 that are shown in FIG. 2 with corresponding numbers 1, 2, 4, and 8 that appear on the display panel. Thus the operator can confirm that he has latched the proper switches and made the desired selection of a specific switch on any multiplexer card. There are three more LEDs that are at display means 155. They are connected in a similar manner, as described for the four LEDs connected to lines 120 and 122–124, to lines 125, 126 and 121. By their "on" or "off" condition they indicate the multiplexer card manually selected. The numbers 16, 32, 64 shown beside the three LEDs are on the panel also to identify the switch latched or not latched.

The latching of one or more of switches 162, 163 and 158 provides logic levels to the inputs of decoder/demultiplexer 135 that provides an output to one of the multiplexer cards other than the first multiplexer card. If none of switches 162, 163 and 158 is latched the input signals to decoder/demultiplexer 135 provide an output signal to the first output above which is the numeral 16 designating the selection of the card containing the first 16 of the switches. The latching only of switch 162 will provide a signal at the second output of decoder/demultiplexer 135. When both of switches 162 and 163 are latched the signal will be at the third output to a line above which is the numeral 48. Similar individual latching and combinations of latching will provide signals to the other indicated outputs of decoder/demultiplexer 135. The eighth multiplexer card is selected when all of switches 162, 163 and 158 are latched. The switches on that card are the last sixteen of the 128 switches on the eight cards.

All seven LEDs are also "on" or "off" in various combinations depending on the selection by the computer during a cycle of operation initiated by a pulse and maintained by signals from the computer.

A line 208 of the printed circuitry on the coupling card is connected to line 173 to provide a signal through a pin and socket arrangement and a line (not numbered) to a LED 209 at display means 155. When there is a device select signal to the system in line 92 LED 209 is lit to indicate at this display panel that the system is then under computer control and operation.

In the foregoing description, especially the detailed description, the system of the invention has been illustrated for its use to select and convert differential analog signals. For this reason the amplifier of the system has been described as a differential operational amplifier. An illustrative amplifier of this type is Model 184 differential operational amplifier sold by Analog Devices, Inc., mentioned above.

The invention is also useful to select single-ended analog signals. In this use the amplifier, that is part of the system, is not a differential amplifier.

The foregoing detailed description is based on low-level signals that are multiplexed to a differential amplifier where the signal level is boosted to 0–10 v. The amplifier may be fixed span/gain (manually adjustable to accommodate the ranges of the input signals), computer programmable, or auto-ranging. Mounting the amplifier on a separate circuit card provides flexiblity for tailoring to the specific application. In that case fixed span/gain amplifiers with an input minimum of −5 mv and a maximum of +50 mv can be used. The shorted multiplexer address provides a 0 mv reference for the amplifier. A precision source of known millivoltage (typically + 48 mv) on another address provides a span reference. In converting binary information from the system, the computer adjusts information from all other multiplexer addresses to conform to these zero and span values. This procedure compensates for possible slight amplifier and analog/digital converter drifts.

If both low-level and high-level signals are handled, the high-level signals and the output of the amplifier for the low-level signals would be routed to a multiplexer address to be multiplexed to the analog/digital converter. Similarly, if two or more low-level signal ranges must be serviced, an alternative to an auto-ranging or programmable amplifier would be the use of additional fixed span/gain amplifiers whose outputs would be routed to multiplexer addresses for direct multiplexing to the analog/digital converter.

If only high-level signals are handled and these are single-ended analog signals, an amplifier is not necessary; thus in the broadest aspect of the system of the invention an amplifier is not required to be a component of the invention between the analog/digital converter and the selectively-actuated switches connectable to sources of analog signals.

The bus 18 can have a process interrupt channel that is used to alert the computer, via a logic-level signal, to perform some non-routine function, such as interrupting a normal scan routine so that a specific switch on a specific multiplexer card can be addressed for obtaining analog information from a specific source such as a process gas chromatograph peak memory. A separate line of the channel is required for each interrupt function.

The foregoing description has been presented solely for the purpose of illustration and not by way of limitation of the invention because the latter is limited only by the claims that follow.

We claim:

1. A multiplexer analog/digital conversion system, useful at a local area for cycles of operation, each cycle interrogating by local selector means at the local area or by a computer located at a remote area, an individual one of a number of analog signals provided by sources at the local area, providing an analog/digital conversion of the analog signal selected during each cycle at the local area, and locally displaying the multi-bit binary information from the conversion, when there is a local selection of the analog signal, or providing that information to a communications bus connecting the system and the computer, when there is a computer selection of the analog signal, which comprises:

a number of switch means, each connectable to a different source of analog signal at the local area and each switch means being responsive to a signal to provide an output signal corresponding to the analog signal;

analog/digital converter means including an analog/digital converter having a number of outputs to provide mutli-bit binary information, input means to receive an analog signal, and a trigger input to receive a pulse that at the leading edge of the pulse resets said converter and at the trailing edge of the pulse initiates a conversion operation for a short period of time to provide at said number of outputs multi-bit binary information representative of the analog signal at said input means, and a status output to provide a pulse during the conversion operation of said analog/digital converter, said input means of said converter being connected to each said number of switch means to receive from the signalled switch means an analog signal, during one cycle of operation of the system, for a conversion of that signal, in response to a pulse to said trigger input of said converter, to provide at said a number of outputs of said converter multi-bit binary information representative of the analog signal from the signalled switch means; and logic means including:

selector means having a decoder/demultiplexer that is responsive to a multi-bit binary information at a number of inputs of said decoder/demultiplexer to provide at one of its number of mutually exclusive outputs a signal, that output being dependent upon that binary information, said decoder/demultiplexer having said number of outputs connected to different switch means of said number of switch means to provide a signal to one of them in accordance with the binary information received by said number of inputs of said decoder/demultiplexer;

gate means comprising a number of gates and an additional gate, each having a first input and a second input and an output, said outputs of said number of gates being connected to different inputs of said decoder/demultiplexer and said number of gates having said first inputs;

means including a number of separate lines corresponding in number to said number of gates, each line being connected only to a different first input of said number of gates and said means being constructed to provide, by said number of lines, to said first inputs of said number of gates signals corresponding to different bits of multi-bit binary information, from signal sources connectable to said number of lines, corresponding, during one cycle of operation, to that information identifying the switch means selected for operation;

means including a line connected to said first input of said additional gate and connectable to a pulse source to provide a pulse to said first input of said additional gate during an early part of the cycle of operation of the system;

means including a line connected to each of said second inputs of said number of gates and said additional gate, said means being connectable to a signal source to provide to these second inputs of said number of gates and said additional gate of said gate means a signal for the period of the cycle of operation of the system to open said additional gate, and to open said number of gates to provide to said decoder/demultiplexer, from said outputs of said number of gates, signals corresponding to the multi-bit binary information provided at said first inputs of said number of gates and to provide a pulse at said output of said additional gate when a pulse is applied to said line connected to said first input of said additional gate; and a monostable multivibrator having an input and an output, said input being connected to said output of said additional gate to receive said pulse from the output of said additional gate to provide at its output a pulse for a predetermined period beginning at the trailing edge of the pulse from said additional gate, said output of said multivibrator being connected to said trigger input of said converter to provide that pulse from said output of said multivibrator to said convertor to reset said converter at the leading edge of said pulse and to initiate at the trailing edge of said pulse from said multivibrator the operation of said converter for a period of time, within the cycle of operation of the system, for the analog/digital conversion to provide the multi-bit binary information to said number of outputs of said converter and to provide a pulse at the status output of said converter during the conversion operation of said converter.

2. The system of claim 1 wherein:

said gate means is a first gate means;

said number of switch means is one set of sets of switch means, each switch means connectable to a different source of analog signal at the local area and each switch means being responsive to a signal to provide an output signal corresponding to the analog signal and being connected to said input means of said converter;

said decoder/demultiplexer of said selector means of said logic means is one of a set of decoder/demultiplexer means that correspond in number to said sets of switch means, each of said set of decoder/demultiplexer means having a number of mutually exclusive outputs connected to different switch means of an individual set of switch means, each decoder/demultiplexer means having a number of inputs, corresponding in number to said number of gates of said first gate means and each input being connected to a different output of said number of gates to provide each decoder/demultiplexer the same multi-bit binary information from said number of gates, and each decoder/demultiplexer means having an additional input that, when signalled, makes operative that decoder/demultiplexer means;

said selector means of said logic means further includes:

second gates means comprising a second number of gates, each having a first input and a second input and an output;

means including a second number of separate lines corresponding in number to said number of gates of said second gate means, each line being connected only to a different first input of said number of gates of said second gate means and said means having said second number of separate lines being constructed to provide, by said second number of lines, to said first inputs of said second number of gates signals corresponding to different bits of another multi-bit binary information, from signal sources connectable to said second number of lines, corresponding, during one cycle of operation, to that information identifying the set of switch means in which is located the switch means selected for operation in that cycle of operation of the system; and an additional decoder/demultiplexer means having a number of inputs to receive said another multi-bit binary information and having a number of outputs, each output being connected to a different one of said additional inputs of said set of decoder/demultiplexer means;

said line, that is connected to each of said second inputs of said number of gates of said first gate means, being connected to said second inputs of said number of gates of said second gate means to open also said number of gates of said second gate means to provide to said outputs of said number of gates of said second gate means and thus to said number of inputs of said another decoder/demultiplexer signals corresponding to said another multi-bit binary information provided at said first inputs of said number of gates of said second gate means; and said first multi-bit binary information and said another multi-bit binary information constitute one part and another part, respectively, of multi-bit information representative of the location of one specific switch means of a specific set of switch means, whereby said other multi-bit binary information to said additional decoder/demultiplexer means provides a signal to one of said additional inputs of said set of decoder/demultiplexer means to make it operative for a cycle of operation of the system and said multi-bit binary information provided to said number of inputs of that decoder/demultiplexer means of the set provides at one of its outputs a signal to one of said switch means of that set connected to the outputs of that decoder/demultiplexer means.

3. The system of claim 2 and further including for local selection and display:

manual selector means connected to said logic means to provide multi-bit binary information to said logic means, said manual selector means comprising a number of manually-operated switches and an additional manually-operated switch all of said manually-operated switches being movable between first and second positions at which they are connectable to different voltage levels, said number of manually-operated switches being connected to said first input of said first and second number of gates of said gate means and said additional manually-operated switch being connected to said first input of said additional gate of said gate means, whereby, when said gates of said gate means have a suitable signal at all of said second inputs, said outputs of all of said number of gates provide the multi-bit binary information to said set of decoder/demultiplexer means and to said additional decoder/demultiplexer means indicative of the positions of said number of manually-operated switches and whereby said additional manually-operated switch when momentarily moved to the second position provides a pulse to said additional gate of said gate means that provides the pulse to said multivibrator; and local display means including:

a first number of optical devices connected to said outputs of said number of gates of said gate means to indicate in binary form by the lighting or lack of lighting of said first number of devices the multi-bit binary information selected by the movement of at least some of said number of manually-operated switches from their first position to their second position; and a second number of optical devices connected to said outputs of said analog/digital converter means to indicate in binary form by the lighting or lack of lighting of said second number of devices the multi-bit binary information at the outputs of said analog/digital converter.

4. The system of claim 3 wherein:

each of said number of switch means of all sets has a pair of inputs connectable to a differential analog signal of said analog signals and have a pair of outputs to provide, when made operative, a differential analog signal, said system further including differential amplifier means having a pair of inputs connected to said pair of outputs of said number of switch means and having an output connected to said converter means to provide said connection of said converter means to each of said number of switch means through said amplifier means so that the signal thus provided is the amplified signal based on a differential analog signal during cycles of operation of the system.

5. The system of claim 4 and further including sets of filter means, each set of filter means comprising filters having outputs connected to the pair of inputs of individual switch means of a set of switch means and having for each filter a pair of inputs connectable to a different source of analog signal.

6. The system of claim 5 and further including a set of printed circuit cards, each card having mounted on it one of said sets of filter means, one of said sets of switch means and one of said set of decoder/demultiplexer means, and each card containing on it conducting lines connecting said decoder/demultiplexer means to said set of switch means, lines connecting said filters of a set to said set of switch means, lines connecting said pair of outputs of said set of switch means to one another, and lines connected to said number of inputs of said decoder/demultiplexer means on that card.

7. The system of claim 1 and further including for computer selection and reading:

optical coupler means having:

a number of optically-coupled isolators, each having an input connectable to a different bit of a number of bits of an information output channel of a communications bus connected to the computer to receive signals representing multi-bit binary information and each having an output connected to a different one of said first inputs of said number of gates of said gate means;

a first additional optically-coupled isolator having an input connectable to a first additional bit of said information output channel of the bus and an output connected to said second input of said number of gates and of said additional gate of said gate means to provide a signal from the computer to the system for a cycle of operation of the system; and a second additional optically-coupled isolator having an input connectable to a second additional bit of said information output channel of said bus and having an output connected to said first input of said additional gate of said gate means to provide a pulse to said first input of said additional gate, at the initial period of time that the signal is provided to said second input of said additional gate, to provide a pulse from said additional gate to said multivibrator;

second gate means comprising:

a number of gates corresponding to the number of said outputs of said converter providing multi-bit binary information, each of said number of gates having a first input connected to a different one of said outputs of said converter means, each one of said number of gates having a second input connected to said output of said first additional isolator to receive the signal provided by the computer to that isolator during the cycle of operation; and an additional gate having a first input that is connected to said output of said first additional optically-coupled isolator to receive the signal from the computer to the system for a cycle of operation of the system, and a second input;

a second multivibrator having:

an input connected to said status output of said analog/digital converter means to receive a pulse during the operation of said converter means for the conversion of an analog signal to multi-bit binary information at said number of outputs of said converter means; and an output connected to said second input of said additional gate of said second gate means to provide to that gate for a predetermined period of time a signal initiated by the pulse to said second timer means from said additional output from said converter means;

second optical coupler means having:

a second number of optically-coupled isolators, each having an input connected to a different one of said number of outputs of said number of gates of said second gate means and each having an output connectable to a different bit of a number of bits of an information input channel of the communications bus connected to the computer to provide, to those bits of the channel, signals that are multi-bit binary information resulting from the analog/digital conversion of the analog signal connected to the converter means for the cycle of operation; and an additional optically-coupled isolator having an input connected to said output of said additional gate of said second gate means and having an output connected to an additional bit of said information input channel of the bus to provide to that additional bit of the input channel a signal to the computer for the predetermined period of operation of said multivibrator by which the computer can recognize that said converter means has converted the selected analog signal and placed the multi-bit binary information as binary signals on said number of bits of the input channel and then the computer, before the completion of the cycle of operation, can function to receive that information.

8. The system of claim 7 wherein:

said first-mentioned gate means is a first gate means;

said number of switch means is one set of sets of switch means, each switch means connectable to a different source of analog signal at the local area and each switch means being responsive to a signal to provide an output signal corresponding to the analog signal and being connected to said input means of said converter;

said decoder/demultiplexer of said selector means of said logic means is one of a set of decoder/demultiplexer means that correspond in number to said sets of switch means, each of said set of decoder/demultiplexer means having a number of mutually exclusive outputs connected to different switch means of an individual set of switch means, each decoder/demultiplexer means having a number of inputs, corresponding in number to said number of gates of said first gate means and each input being connected to a different output of said number of gates to provide each decoder/demultiplexer the same multi-bit binary information from said number of gates of said first gate means, and each decoder/demultiplexer means having an additional input that, when signalled, makes operative that decoder/demultiplexer means;

said selector means of said logic means further includes:

third gates means comprising a third number of gates, each having a first input and a second input and an output;

means including a second number of separate lines corresponding in number to said number of gates of said third gate means, each line being connected only to a different first input of said number of gates of said third gate means and said means having said second number of separate lines being constructed to provide, by said second number of lines, to said first inputs of said third number of gates signals corresponding to different bits of another multi-bit binary information, from signal sources connectable to said second number of lines, corresponding, during one cycle of operation, to that information identifying the set of switch means in which is located the switch means selected for operation in that cycle of operation of the system; and an additional decoder/demultiplexer means having a number of inputs connected to said outputs of said number of gates of said third gate means to receive said another multi-bit binary information and having a number of outputs, each output being connected to a different one of said additional inputs of said set of decoder/demultiplexer means;

said line, that is connected to each of said second inputs of said number of gates of said first gate means, being connected to said second inputs of said number of gates of said third gate means to open also said number of gates of said third gate means to provide to said outputs of said number of gates of said third gate means and thus to said number of inputs of said additional decoder/demultiplexer signals corresponding to said another multi-bit binary information provided at said first inputs of said number of gates of said third gate means; and said first multi-bit binary information and said another multi-bit binary information constitute one part and another part, respectively, of multi-bit information representative of the location of one specific switch means of a specific set of switch means, whereby said other multi-bit binary information to said additional decoder/demultiplexer means provides a signal to one of said additional inputs of said set of decoder/demultiplexer means to make it operative for a cycle of operation of the system and said multi-bit binary information provided to said number of inputs of that decoder/demultiplexer means of the set provides at one of its outputs a signal to one of said switch means of that set connected to the outputs of that decoder/demultiplexer means.

9. The system of claim 8 wherein:

each of said number of switch means has a pair of inputs connectable to a differential analog signal of said analog signals and has a pair of outputs to provide, when made operative, a differential analog signal, said system further including differential amplifier means having a pair of inputs connected to said pair of outputs of said number of switch means and having an output connected to said converter means to provide said connection of said converter means to each of said number of switch means through said amplifier means so that the signal thus provided is the amplified signal based on a differential analog signal during cycles of operation of the system.

10. The system of claim 9 and further including sets of filter means, each set of filter means comprising filters having outputs connected to the pair of inputs of individual switch means of a set of switch means and having for each filter a pair of inputs connectable to a different source of analog signal.

11. The system of claim 10 and further including a set of printed circuit cards, each card having mounted on it one of said sets of filter means, one of said sets of switch means and one of said set of decoder/demultiplexer means, and each card containing on it conducting lines connecting said decoder/demultiplexer means to said set of switch means, lines connecting said filters of a set to said set of switch means, lines connecting said pair of outputs of said set of switch means to one another, and lines connected to said number of inputs of said decoder/demultiplexer means on that card.

12. The system of claim 11 and further including:
   an insulated box;
   a metal plate mounted inside said box;
   terminal strips mounted on said plate and having double pairs of connectors, most of said double pairs having a pair connectable to a different one of analog signals and connected to the other pair of that double pair of connectors, said other pairs being connected to different filters on said cards;
   means, outside said box, to provide a span reference differential analog voltage signal;
   means connecting said span reference signal to a pair of a first another one of said double pairs of connectors;
   temperature-sensing means to provide a differential analog signal and mounted on said plate;
   bridge circuit means, outside said box, connected to said temperature-sensing means to receive the analog signal from said temperature-sensing means;
   means connecting said bridge circuit means to the pair of a second of another one of said double pairs of connectors to provide a differential analog signal based on the analog signal provided by said temperature-sensing means; and
   a third another one of a double pair of connectors connected to a zero reference voltage source, each of said first, second and third another ones of double pairs of connectors having one pair connected to the other pair of connectors of that double pair and said another pair of each being connected to a different one of said filters mounted on one of said cards.

13. The system of claim 8 wherein said gates of said first and third gate means are NAND gates and said system further including for local selection and display:
   fourth gate means comprising:
      a number of NAND gates, corresponding to the total of said number of gates of said first gate means and said number of gates of said third gate means, and an additional gate, each having a first input and a second input and an output, some of said outputs of said number of gates being connected to different inputs of said additional decoder/demultiplexer means and each of the other of said outputs of said number of gates being connected to different inputs of each of said set of decoder/demultiplexer means, said additional gate of said fourth gate means having its output connected to said input of said first multivibrator;
   manual selector means connected to 'said logic means to provide multi-bit binary information to said logic means, said manual selector means comprising a number of manually-operated switches and an additional manually-operated switch, all of said manually-operated switches being movable between first and second positions at which they are connectable to different voltage levels, said number of manually-operated switches being connected to different inputs of said first inputs of said number of gates of said fourth gate means and said additional manually-operated switch being connected to said first input of said additional gate of said fourth gate means, whereby, when said number of gates of said fourth gate means have a suitable signal at all of said second inputs, said outputs of all of said number of gates of said fourth gate means provide the multi-bit binary information to said set of decoder/demultiplexer means and to said additional decoder/demultiplexer means indicative of the positions of said number of manually-operated switches, and whereby said additional manually-operated switch when momentarily moved to the second position provides a pulse to said additional gate of said fourth gate means that provides, when that additional gate has said suitable signal at its second input, the pulse to said first multivibrator;
   local display means including:
      a first number of optical devices connected to said outputs of said number of said manually-operated switches to indicate in binary form by the lighting or lack of lighting of said first number of devices the multi-bit binary information selected by the movement of at least some of said number of manually-operated switches from their first position to their second position; and
      a second number of optical devices connected to said outputs of said analog/digital converter means to indicate in binary form by the lighting or lack of lighting of said second number of devices the multi-bit binary information at the outputs of said analog/digital converter; and
   means including a line providing connection between said first additional isolator of said first coupler means and said second inputs of said first and third gate means and means including a line and an inverter providing said connection between that isolator and said second inputs of said fourth gate means, whereby there is an enabling signal only to said second inputs of said first and third gate means when that isolator is signalled by the computer and there is an enabling signal only to said second inputs of said fourth gate means when said input to that isolator is not signalled by the computer, so that manual selection and initiation of a cycle of operation is locked out during a computer-operated cycle of operation of the system.

14. The system of claim 13 wherein:
   each of said number of switch means has a pair of inputs connectable to a differential analog signal of said analog signals and has a pair of outputs to provide, when made operative, a differential analog signal,
   said system further including:
      differential amplifier means having a pair of inputs connected to said pair of outputs of said number of switch means and having an output connected to said converter means to provide said connection of said converter means to each of said number of switch means through said amplifier means so that the signal thus provided is the amplified signal based on a differential analog signal during cycles of operation of the system;
      sets of filter means, each set of filter means comprising filters having outputs connected to the pair of inputs of individual switch means of a set of switch means and having for each filter a pair of inputs connectable to a different source of analog signal; and a set of printed circuit cards, each card having mounted on it one of said sets of filter means, one of said sets of switch means and one of said set of decoder/demultiplexer means, and each card containing on it conducting lines connecting said decoder/demultiplexer means to said set of switch means, lines connecting said filters of a set to said set of switch means, lines connecting said pair of outputs of said set of switch means to one another, and lines connected to said number of inputs of said decoder/demultiplexer means on that card.

15. The system of claim 14 and further including:

an insulated box;

a metal plate mounted inside said box;

terminal strips mounted on said plate and having double pairs of connectors, most of said double pairs having a pair connectable to a different one of analog signals and connected to the other pair of that double pair of connectors, said other pairs being connected to different filters on said cards;

means, outside said box, to provide a span reference differential analog voltage signal;

means connecting said span reference signal to a pair of a first another one of said double pairs of connectors;

temperature-sensing means to provide a differential analog signal and mounted on said plate;

bridge circuit means, outside said box, connected to said temperature-sensing means to receive the analog signal from said temperature-sensing means;

means connecting said bridge circuit means to the pair of a second of another one of said double pairs of connectors to provide a differential analog signal based on the analog signal provided by said temperature-sensing means; and a third another one of a double pair of connectors connected to a zero reference voltage source, each of said first, second and third another ones of double pairs of connectors having one pair connected to the other pair of connectors of that double pair and said another pair of each being connected to a different one of said filters mounted on one of said cards.

16. The system of claim 15 wherein said first number of optical devices are connected to said outputs of said number of said manually-operated switches by being connected to said outputs of said number of gates of said third gate means that are connected along with said outputs of said number of gates of said first gate means to the inputs of said set of decoder/demultiplexer means and said additional decoder/demultiplexer means, so that said first number of optical devices, during a computer-operated cycle of operation of the system, indicate in binary form by the lighting or lack of lighting of said first number of devices the multi-bit binary information provided by the computer for a selection of the switch means selected and actuated for a conversion of the analog signal connected to that switch means rather than multi-bit binary information manually selected by the position of the manually-operated switches but locked out for the computer-operated cycle.

17. The system of claim 16 and further including:

third optical coupler means having a number of optically-coupled isolators;

a bus having a binary information output channel and a binary information input channel, said input channel having a number of bits and an additional bit and said output channel having a first number of bits, a second number of bits, a third number of bits and a first additional bit, all of said bits of said input and output channels being connected to different inputs and different outputs, respectively, of a digital computer, and;

said first number of bits of said output channel being connected to inputs of another decoder/demultiplexer having one of its outputs connected to said first optical coupler means;

said second number of bits of said output channel being connected at said input of said number of optically-coupled isolators of said first optical coupler means;

third number of bits of said output channel being connected to said inputs of said number of said optically-coupled isolators of said third optical coupler means;

said additional bit of said output channel being connected to said input of said second additional optically-coupled isolator;

said number of bits of said input channel being connected to said output of said additional optically-coupled isolator of said second optical coupler means;

a third monostable multivibrator having an input connected to said output of said second multivibrator;

an inverter connected to the output of said third multivibrator; and an optical device connected to the output of said inverter connected to said third multivibrator, whereby said third multivibrator, said inverter connected to it and said optical device connected to that inverter provides for lighting of that optical device for a predetermined period of time that is longer than the period of time that the second multivibrator provides its output signal to the additional bit of said input channel of said bus so that it can be seen that the system is operating to receive and transfer vinary information from and to, respectively, the computer.

* * * * *

UNITED STATES PATENT AND TRADEMARK OFFICE
CERTIFICATE OF CORRECTION

PATENT NO. : 3,968,487
DATED : July 6, 1976
INVENTOR(S) : William M. Herring et al.

It is certified that error appears in the above–identified patent and that said Letters Patent are hereby corrected as shown below:

Column 1, line 21, "." should be --,--.
          Line 46, "computerprogrammed" should read --computer programmed--.
Column 6, line 18, "used" should read --use--.
Column 9, line 7, "printed card" should read --printed circuit card--.
          Line 50, "car" should read --card--.
Column 10, line 51, "only" should read --not only--.
Column 11, line 10, "FIG. 27" should read --FIG. 2--.
          Line 22, "192" should read --182--.
          Line 39, "177" should read --117--.
Column 15, line 22, "this" should read --the--.
Column 16, line 47, "each" should read --each of--.
Column 21, line 1, "timer means" should read --multivibrator--.
          Line 23, "multivibrator" should read --second multivibrator--.
Column 26, line 55, "vinary" should read --binary--.

Signed and Sealed this

Thirtieth Day of November 1976

[SEAL]

Attest:

RUTH C. MASON
*Attesting Officer*

C. MARSHALL DANN
*Commissioner of Patents and Trademarks*